US009006754B2

(12) United States Patent  
Cho

(10) Patent No.: US 9,006,754 B2
(45) Date of Patent: Apr. 14, 2015

(54) MULTICHIP LIGHT EMITTING DIODE (LED) AND METHOD OF MANUFACTURE

(75) Inventor: Byoung gu Cho, Seoul (KR)

(73) Assignee: Lightizer Korea Co., Seoul (KR)

( * ) Notice: Subject to any disclaimer, the term of this patent is extended or adjusted under 35 U.S.C. 154(b) by 464 days.

(21) Appl. No.: 12/750,823

(22) Filed: Mar. 31, 2010

(65) Prior Publication Data

US 2011/0241023 A1    Oct. 6, 2011

(51) Int. Cl.
| H01L 33/00 | (2010.01) |
| H01L 25/00 | (2006.01) |
| H01L 25/075 | (2006.01) |
| H01L 33/44 | (2010.01) |
| H01L 33/50 | (2010.01) |

(52) U.S. Cl.
CPC ............ *H01L 25/50* (2013.01); *H01L 25/0753* (2013.01); *H01L 33/44* (2013.01); *H01L 33/507* (2013.01); *H01L 2224/48091* (2013.01); *H01L 2224/48227* (2013.01)

(58) Field of Classification Search
CPC ....... H01L 33/50; H01L 33/52; H01L 33/502; H01L 33/504
USPC ................................................ 257/88, 79, 98
See application file for complete search history.

(56) References Cited

U.S. PATENT DOCUMENTS

| 6,650,044 B1 | 11/2003 | Lowery |
| 2005/0225232 A1 | 10/2005 | Boroson et al. |
| 2006/0055309 A1* | 3/2006 | Ono et al. ..................... 313/492 |
| 2008/0124574 A1 | 5/2008 | Shoda et al. |
| 2008/0173884 A1 | 7/2008 | Chitnis et al. |
| 2008/0179611 A1 | 7/2008 | Chitnis et al. |
| 2008/0220285 A1 | 9/2008 | Vestweber et al. |
| 2009/0057690 A1 | 3/2009 | Chakraborty |
| 2009/0065790 A1 | 3/2009 | Chitnis et al. |

(Continued)

OTHER PUBLICATIONS

Non-final Office Action dated Feb. 3, 2011, for U.S. Appl. No. 12/750,816, filed Mar. 31, 2010.

(Continued)

*Primary Examiner* — Daniel Whalen
*Assistant Examiner* — Suberr Chi
(74) *Attorney, Agent, or Firm* — Keohane & D'Alessandro PLLC; Hunter E. Webb

(57) ABSTRACT

The present invention provides a multichip LED and method of manufacture in which white light is produced. Specifically, a plurality of electrically interconnected LED chips (e.g., interconnected via red metal wire) is selected for conversion of light to white light. In a typical embodiment, the LED chips comprise: a blue LED chip, a red LED chip, a green LED chip, and a target LED chip whose light output is converted to white light. A wavelength of a light output by one or more of the plurality of chips will be measured. Based on the wavelength measurement, a conformal coating is applied to the one or more of the LED chips. The conformal coating has a phosphor ratio that is based on the wavelength. Moreover, the phosphor ratio is comprised of at least one of the following colors: yellow, green, or red. Using the conformal coating the light output of the target LED is then converted to white light. In a typical embodiment, these steps are performed at the wafer level so that uniformity and consistency in results can be better obtained. Several different approaches can be implemented for isolating the coating area. Examples include the use of a paraffin wax, a silk screen, or a photo resist. Regardless, this approach allows multiple chips to be treated simultaneously.

7 Claims, 8 Drawing Sheets

(56) References Cited

U.S. PATENT DOCUMENTS

| | | |
|---|---|---|
| 2009/0080185 A1* | 3/2009 | McMillan ................. 362/231 |
| 2009/0152572 A1* | 6/2009 | Su et al. ................. 257/89 |
| 2010/0102335 A1 | 4/2010 | Takagi et al. |
| 2011/0006327 A1 | 1/2011 | Park et al. |
| 2011/0079815 A1 | 4/2011 | Yamada et al. |
| 2011/0227108 A1* | 9/2011 | Tetz et al. ................. 257/98 |

OTHER PUBLICATIONS

Donald L. Raleigh, USPTO Office Action, U.S. Appl. No. 12/960,723, Mail Date Aug. 24, 2012, 20 pages.

Suberr L. Chi, USPTO Office Action, U.S. Appl. No. 13/785,187, Notification Date Jul. 3, 2014, 14 pages.

* cited by examiner

MULTICHIP LIGHT EMITTING DIODE (LED) AND METHOD OF MANUFACTURE

CROSS-REFERENCE TO RELATED INVENTION

The present invention is related in some aspects to commonly-owned and co-pending application Ser. No. 12/693,632, filed Jan. 26, 2010, and entitled LIGHT EMITTING DIODE (LED) AND METHOD OF MANUFACTURE, the entire contents of which are herein incorporated by reference.

FIELD OF THE INVENTION

The present invention generally relates to LEDs. Specifically, the present invention relates to the manufacture of multichip LEDs to produce white light.

BACKGROUND OF THE INVENTION

As LEDs continue to grow in popularity as an efficient technological approach, the need for continued advancement grows as well. Along these lines, obtaining white light output from LEDs is not only needed, but also difficult to achieve. Many approaches in the past have attempted to find new ways to obtain white light. However, many of these approaches perform such processing at the chip level instead of at the wafer level. Such an approach can result in chip waste. Moreover, none of the existing approaches vary phosphor ratios based on an underlying device measurement (such as a wavelength of a light output). In view of the foregoing, there exists a need for an LED and associated method of manufacture that addresses the deficiencies of the related art.

SUMMARY OF THE INVENTION

In general, the present invention provides a multichip LED and method of manufacture in which white light is produced. Specifically, a plurality of electrically interconnected LED chips (e.g., interconnected via red metal wire) is selected for conversion of light to white light. In a typical embodiment, the LED chips comprise a blue LED chip, a red LED chip, a green LED chip, and a target LED chip whose light output is converted to white light. A wavelength of a light output by one or more of the plurality of chips will be measured. Based on the wavelength measurement, a conformal coating is applied to the one or more of the LED chips. The conformal coating has a phosphor ratio that is based on the wavelength. Moreover, the phosphor ratio is comprised of at least one of the following colors: yellow, green, or red. Using the conformal coating, the light output of the target LED is then converted to white light. In a typical embodiment, these steps are performed at the wafer level so that uniformity and consistency in results can be better obtained. Several different approaches can be implemented for isolating the coating area. Examples include the use of a paraffin wax, a silk screen, or a photo resist. Regardless, this approach allows multiple chips to be treated simultaneously.

A first aspect of the present invention provides a method for manufacturing a multichip light emitting diode (LED chip), comprising: providing a plurality of LED chips in electrical contact with each other; applying a conformal coating to at least one of the plurality of LED chips, the conformal coating having a phosphor ratio that is based on a previous measurement; and converting a light output of a target LED chip of the plurality of LED chips to white light using the conformal coating.

A second aspect of the present invention provides a multichip light emitting diode (LED), comprising: a plurality of LED chips in electrical contact with each other, the plurality of LED chips comprising a blue LED chip, a red LED chip, a green LED chip and a target LED chip; a conformal coating applied to at least one of the plurality of LED chips, the conformal coating having a phosphor ratio that is based on a previous measurement; and wherein a light output of the target LED chip is converted to white light using the conformal coating.

A third aspect of the present invention provides a multichip light emitting diode (LED), comprising: a plurality of LED chips in electrical contact with each other, the plurality of LED chips comprising a blue LED chip, a red LED chip, a green LED chip, and a target LED chip; wherein the conformal coating applied to at least one of the plurality of LED chips, the conformal coating having a phosphor ratio that is based on a previous measurement, wherein a light output of the target LED chip is converted to white light using the conformal coating; and wherein the plurality of LED chips are interconnected with a red metal line.

BRIEF DESCRIPTION OF THE DRAWINGS

These and other features of this invention will be more readily understood from the following detailed description of the various aspects of the invention taken in conjunction with the accompanying drawings in which.

Figure 1:
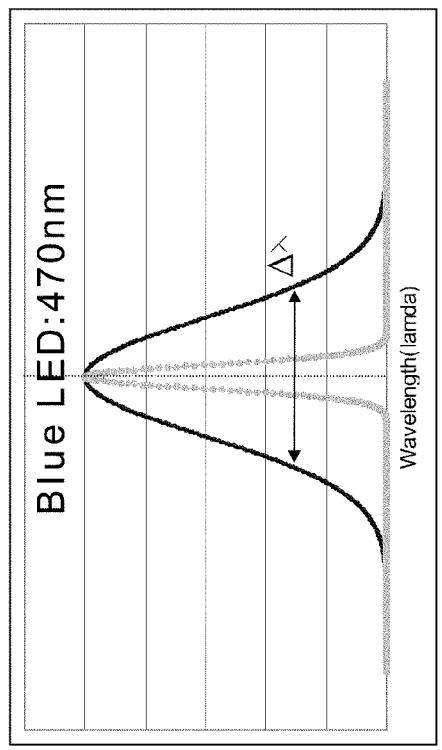
FIG. 1 depicts a chip wavelength distribution graph in the LED wafer in accordance with an embodiment of the present invention.
Figure 1:
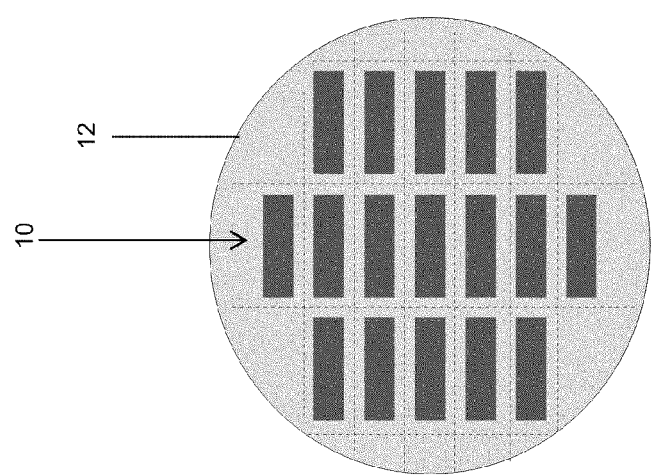

The drawings are not necessarily to scale. The drawings are merely schematic representations, not intended to portray specific parameters of the invention. The drawings are intended to depict only typical embodiments of the invention, and therefore should not be considered as limiting the scope of the invention. In the drawings, like numbering represents like elements.

DETAILED DESCRIPTION OF THE INVENTION

In general, the present invention provides a multichip LED and method of manufacture in which white light is produced. Specifically, a plurality of electrically interconnected LED chips (e.g., interconnected via red metal wire) is selected for conversion of light to white light. In a typical embodiment, the LED chips comprise a blue LED chip, a red LED chip, a green LED chip, and a target LED chip whose light output is converted to white light. A wavelength of a light output by one or more of the plurality of chips will be measured. Based on the wavelength measurement, a conformal coating is applied to the one or more of the LED chips. The conformal coating has a phosphor ratio that is based on the wavelength. Moreover, the phosphor ratio is comprised of at least one of the following colors: yellow, green, or red. Using the conformal coating the light output of the target LED is then converted to white light. In a typical embodiment, these steps are performed at the wafer level so that uniformity and consistency in results can be better obtained. Several different approaches can be implemented for isolating the coating area. Examples include the use of a paraffin wax, a silk screen, or a photo resist. Regardless, this approach allows multiple chips to be treated simultaneously.

FIGS. 1-4 describe a process for treating one or more chips of the array of FIGS. 5-8. This processing results in conversion of a light output by at least one of the array/plurality of chips to white light. To provide a proper context, the process will be described first, and then applied to the illustrative chip array shown in the drawings.

A wavelength distribution exists due to an EPI in-line MOCVD (metal organic chemical vapor deposition) process drift and facility deviation of the LED chip between each chip within a LED wafer. FIG. 1 depicts the result of measuring the wavelength of blue light for chips 10 within an arbitrary LED wafer 12. In FIG. 1, chips are unable to have the same monochromatic light output within the wafer, and it has a distribution between chips. In general, in the case of the wave length, a difference is generated between chips that are over 5 nm, and the recognition capability is that of human vision.

Figure 2:
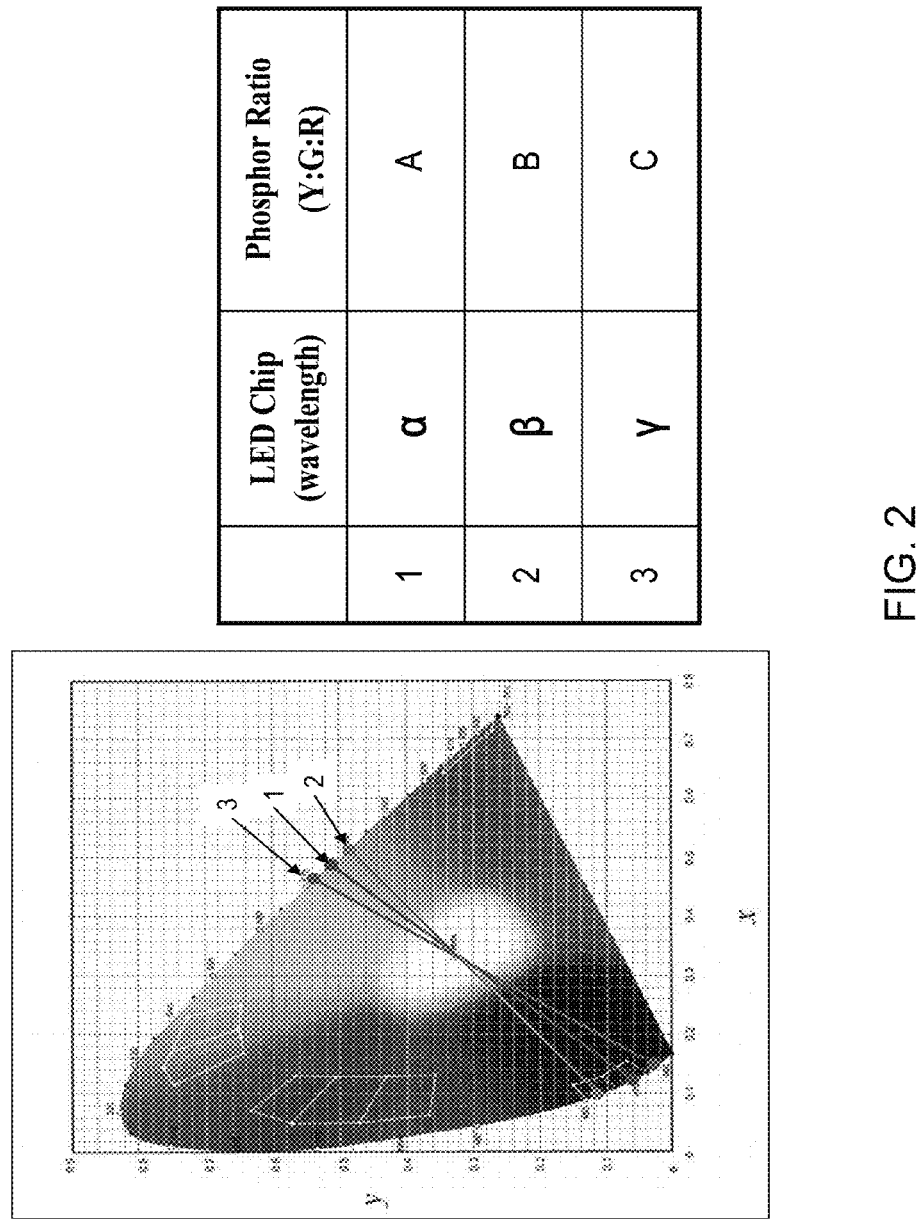
FIG. 2 depicts a graphic representation of the chromaticity diagram in accordance with an embodiment of the present invention.

FIG. 2 shows a RGB chromaticity diagram. Because the wavelength distribution exists similar to FIG. 1 within the wafer between chips, in the case of applying a fluorescent substance of an identical combination ratio in the wafer level in order to implement white, the white color output coordinate is changed on each chip. That is, the wavelength dissemination of the white chip is enlarged.

Therefore, only when the combination ratio of the fluorescent substance applied according to the wavelength of the chip is appropriate, the same target white chip implementation is possible. In the chromaticity diagram of FIG. 2, the wavelength of chip number 1 is α. This ratio of yellow, red, and green (Y, R, G) should be applied according to combination ratio A of the fluorescent substance and silicon to form the white target color output coordinate. Moreover, as to chip numbers 2 and 3, the wavelengths of β and γ need be applied. To form the same white target color output coordinate as chip number 1, ratios of B and C have to be applied to chip numbers 2 and 3 (respectively).

If the combination ratio of the coating film (fluorescent substance plus silicon) is identical for α, β, γ in which the chips are different wavelengths, then the white target color output coordinate of the three chips will be different. There is a difficulty in the BLU (back light unit), and a lamp in the LED application with the color dispersion occurrence in the product configuration if the white color output coordinate is changed. The process is implemented at the discrete chip level (not the wafer level) in the coating process of the fluorescent substance in regard to this kind of a problem (binning problem) in the LED PKG (package) process. Before implementing the dispensing process of coating the fluorescent substance, the sorting (or ranking) is made of the chips for each wavelength of the blue light output from the chips.

Figure 3:
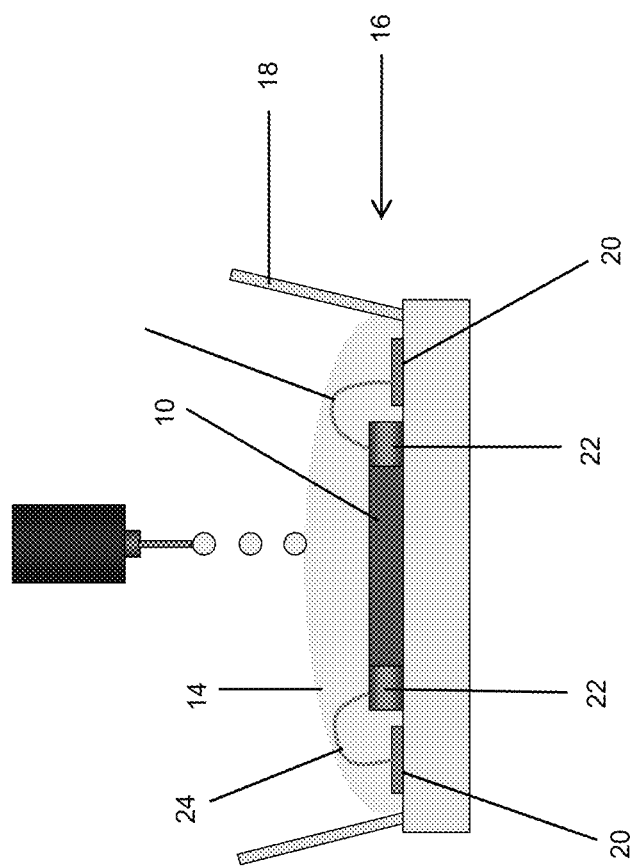
FIG. 3 depicts a method of coating fluorescent substance at the existing chip unit PKG level in accordance with an embodiment of the present invention.

Referring now to FIG. 3, the process where the fluorescent substance coating 14 is applied is schematically shown. There is lead frame 16 including cup 18 in advance, the LED chip 10 is attached in the center of the cup, and the metal pad 20 and lead frame 22 are connected by the wire bond 24. The coating film 14 (fluorescent substance plus silicon) material, which fits to the wavelength of the corresponding chip 10, and in which it is designed in the LED chip surface in order to form the white target color output, is coordinated with dispensing. This described chip level fluorescent substance coating technology has several problems.

First, because of the thick coating film (over the minimum 300 um) of the fluorescent substance plus silicon, the optical mean free path is changed according to the LED chip surface location, and the color deviation is caused (in other words, binning phenomenon). When it designs optically, this color deviation occurrence brings many elements.

Second, the fluorescent substance coating process is not conducted at the wafer level, but is done at the chip level. As a result, the separate package material and process cost are additionally generated. Moreover, the chip cost of the inferior chip is generated by the white color output coordinate deviation after the package process. The sorting process is classified with chips within the wafer accompanied according to the same wavelength band because the wavelength distribution is quantified in advance according to the chip level coating. In this case, the long process time and equipment investment cost, etc., are generated. The separate sorting process is unnecessary if the fluorescent substance application process of each unit chip is conducted at the wafer level. Since it is not the package level, and the white color output coordinate is already obtained from the unit wafer level, the separate package process and material cost are not generated in addition to the inferior chip performance variation.

As indicated above, under the present invention, the white light-emitting diode manufacturing method performs the white light-emitting diode manufacturing process in the wafer level differently than the chip level packaging method. In particular, in the described lower-stage wafer level, after the wavelength data of each chip is measured in advance in order to control the fluorescent substance (yellow, blue, green) combination ratio, in which it is appropriate for each unit chip for the corresponding for each wavelength, accurately and radiate the white light in the wafer level according to each chip, the appropriately coated film is made with fluorescent substance plus silicon by using the dispensing method. In this way, the fluorescent substance conformal coating in which it has the thickness fixed, and is thin in the chip surface, is the basis of the possible method (chip level conformal coating: CLCC). In the present invention, the meaning of the wafer level points to the wafer state that discrete chips do not occur before the dicing process.

Figure 4:
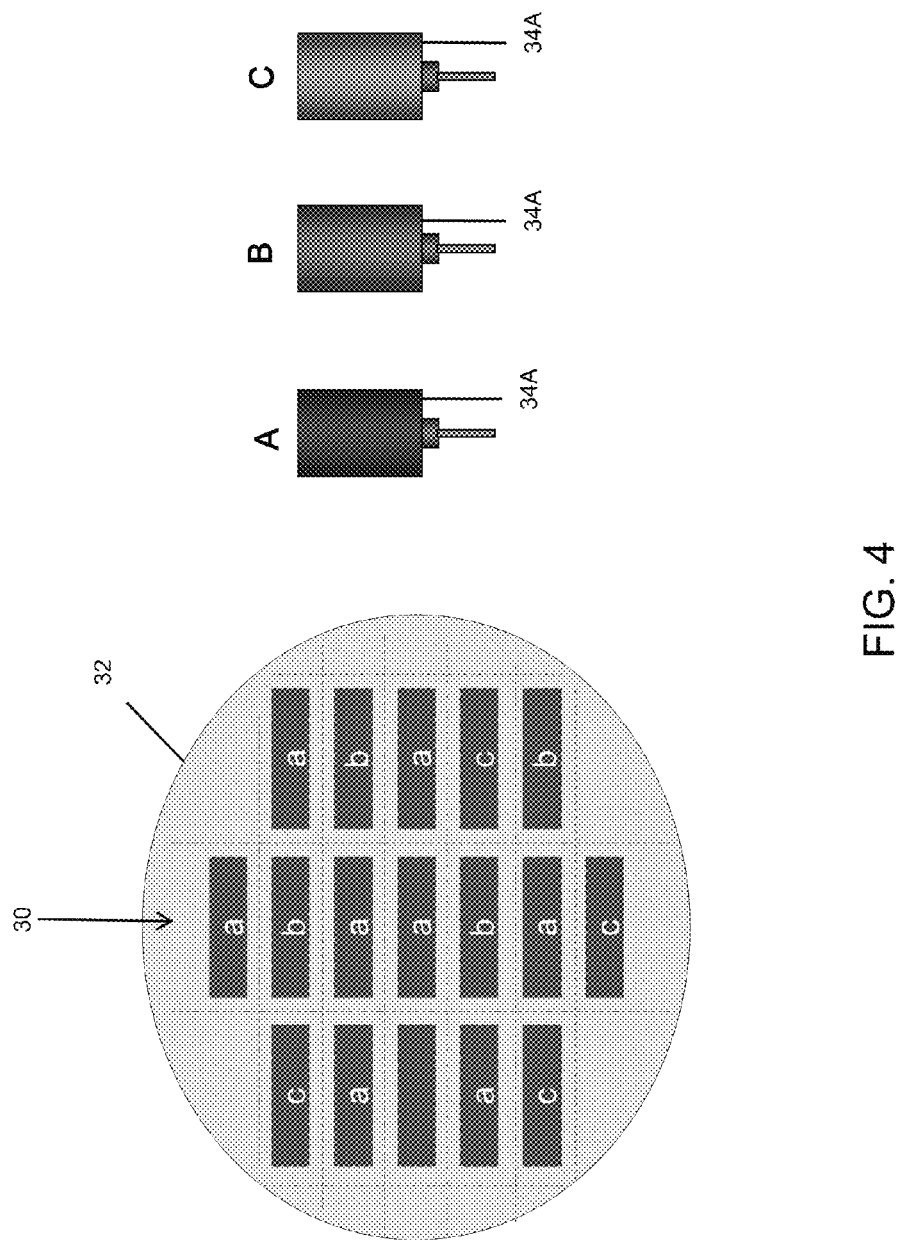
FIG. 4 depicts a graphic representation of a chip level conformal coating (CLCC) mode in the wafer level in accordance with an embodiment of the present invention.

In FIG. 4, an additional feature of the present invention is schematically shown. In order to implement the target white color output coordinate in which it is identical with respect to all chips 30 in wafer 32, a proper fluorescent substance combination ratio in which it has to be coated in each unit chip by using the result of measuring the wavelength of chips 30 is determined. For example, the combination ratio of A in case of the wavelength α, the combination ratio of B in case of the wavelength β, and the combination ratio of C in case of the wavelength γ is applied. Dispensers 34A-C corresponded to the multiple combination ratio and three coating materials are prepared. Each dispenser 34A-C is filled with the fluorescent substance of the respectively different combination ratio A, B, or C.

As seen in FIG. 4, dispenser 34A-C makes the coated film (fluorescent substance plus silicon material) in which it corresponds to each unit chip while at the wafer level by the dispensing method. Therefore, it is comprised of the fluorescent substance conformal coating in the chip top surface. In this way, the white LED is ultimately implemented in the wafer level through the fluorescent substance coating. Under the present invention, three examples in which it independently coats the fluorescent substance plus silicon material in the wafer level according to each unit chip 30 are proposed.

Figure 5:
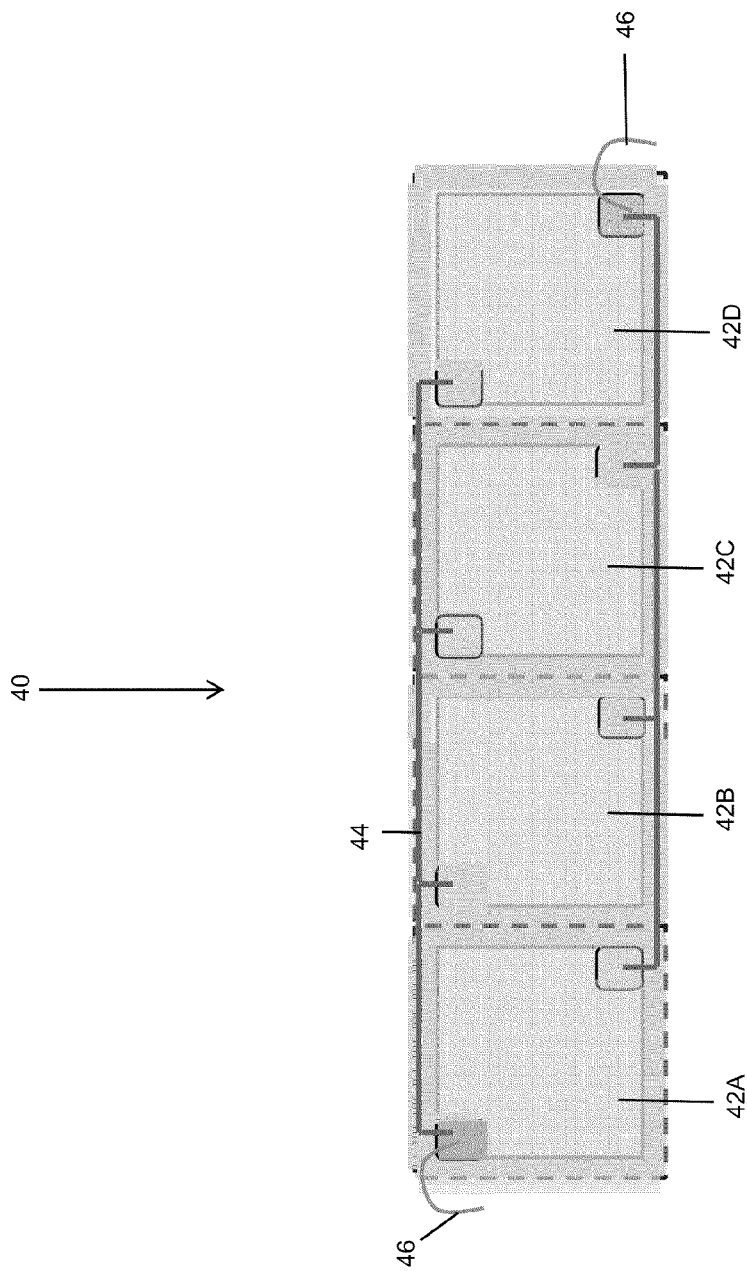
FIG. 5 depicts a plurality of interconnected LED chips in accordance with an embodiment of the present invention.

These techniques will not be applied in the context of a plurality or an array of LED chips. Referring to FIG. 5, an illustrative array/plurality of LED chips 40 is shown. As depicted, array 40 comprises chips 42A-D electrically interconnected via red metal lines 44. In addition, ground contacts 46 are used to connect array 40 to a ground. It should be understood in advance when the terms such as "red LED chip", "blue LED chip", "green LED chip" are used herein, what is meant is that the LED chips produce light having those colors (e.g., red light, blue light, green light, etc.). Thus, "red LED chip" is an abbreviated way of saying "red light producing LED chip".

Figure 6:
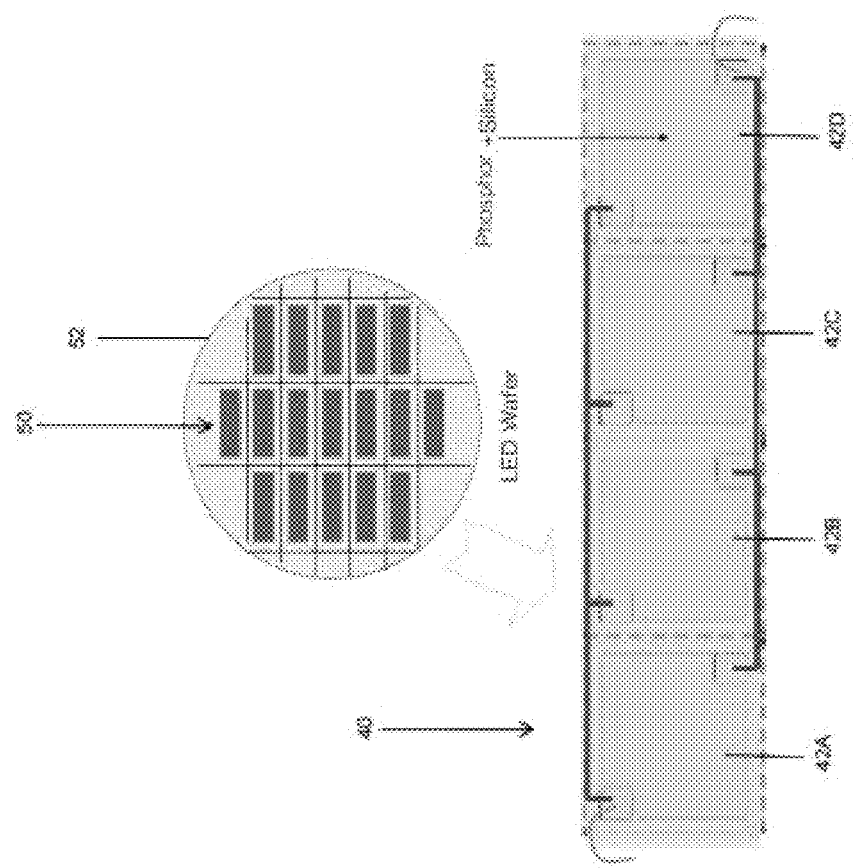
FIG. 6 depicts the plurality of interconnected LED chips of FIG. 5 in relation to the wafer of FIG. 1 in accordance with an embodiment of the present invention.

Regardless, referring now to FIG. 6, an illustrative embodiment according to the present invention is shown. As depicted, array of chips 50 is drawn from chips 50 of wafer 52. In a typical embodiment, array of chips 40 comprise four chips 42A-D: a red LED chip 42A, a green LED hip 42B, a blue LED chip 42C, and a target LED chip 42D whose light output will be converted to white light under the present invention.

Figure 7:
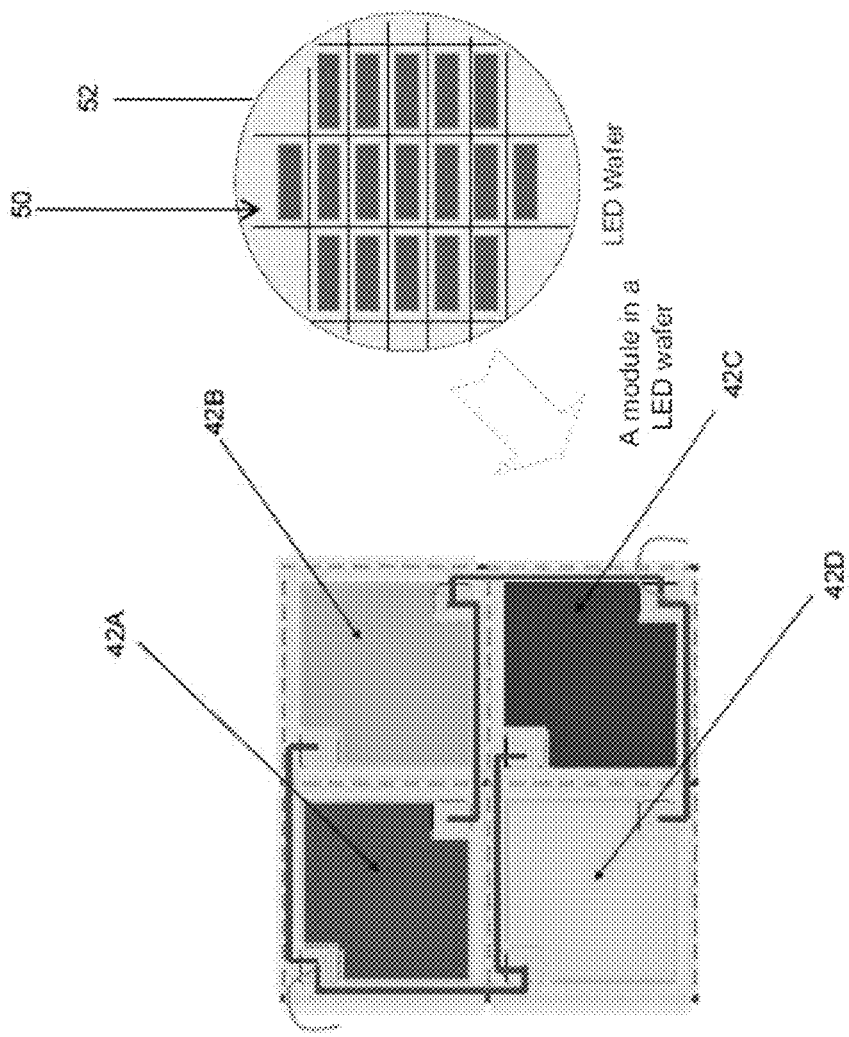
FIG. 7 depicts a specific color scheme and interconnection of a plurality of LED chips after conversion of a light output by a target LED chip to white light in accordance with an embodiment of the present invention.

Referring to FIG. 7, this process will be described in greater detail. As depicted, red LED chip 42A, green LED chip 42B, blue LED chip 42C, and target LED chip 42D are electrically interconnected in a 2×2 matrix format. Prior to or after this interconnection, LED chips 42A-D are coated with the conformal coating as described above in conjunction with FIGS. 1-4. Specifically, a wavelength of light output of one or more LED chips 42A-D is measured. Based on this measurement, a conformal coating is applied to one or more of LED chips 42A-D. As described above in conjunction with FIGS. 1-4, a certain wavelength will result in the application of a conformal coating having a corresponding phosphor ratio (e.g., comprised of yellow, green and/or red). Moreover, the conformal coating can be applied to any or all LED chips 42A-D using any of the isolation techniques discussed herein. Illustrative techniques for isolating the area to which the conformal coating is applied include (among others): (1) using a paraffin wax; (2) using a silk screen; and (3) using a photo resist. Using the conformal coating, the light output by target LED chip 42D will be converted to white light.

The foregoing description of various aspects of the invention has been presented for purposes of illustration and description. It is not intended to be exhaustive or to limit the invention to the precise form disclosed and, obviously, many modifications and variations are possible. Such modifications and variations that may be apparent to a person skilled in the art are intended to be included within the scope of the invention as defined by the accompanying claims.

Figure 8:
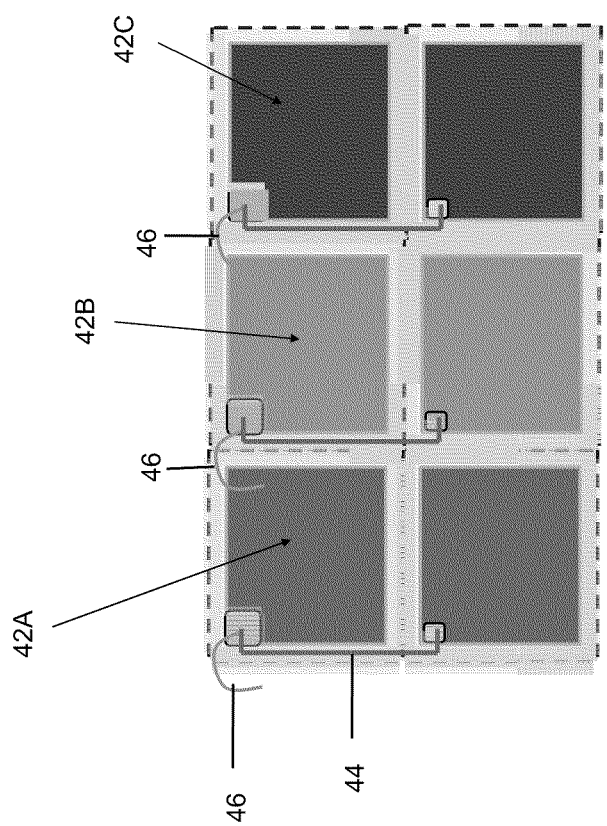
FIG. 8 depicts a wiring schematic of a plurality of red, green, and blue LED chips in accordance with an embodiment of the present invention.

Referring to FIG. 8, the interconnection of LED chips 42A-C is shown in greater detail. As depicted, matching pairs of LED chips 42A-C are interconnected using red wire 44, and ground contacts 46.

The foregoing description of various aspects of the invention has been presented for purposes of illustration and description. It is not intended to be exhaustive or to limit the invention to the precise form disclosed and, obviously, many modifications and variations are possible. Such modifications and variations that may be apparent to a person skilled in the art are intended to be included within the scope of the invention as defined by the accompanying claims.

What is claimed is:

1. A multichip light emitting diode (LED), comprising:
   a plurality of LED chips fabricated on a wafer, the plurality of LED chips consisting of a blue LED chip, a red LED chip, a green LED chip, and a target LED chip, wherein the plurality of LED chips are in electrical contact with each other via a metal line;
   a set of conformal coatings that cover an isolated active area of each of the plurality of LED chips fabricated on the wafer, wherein each conformal coating of the set of conformal coatings comprises a phosphor and silicon ratio producing colors selected from a group consisting of yellow, green, and red that is based on a measurement of a wavelength of a light output that is particular to an LED chip of the plurality of LED chips that is covered by the each conformal coating; and
   wherein a light output of the target LED chip is converted to white light using the set of conformal coatings.

2. The multichip LED of claim 1, wherein the isolated active are is isolated by paraffin wax.

3. The multichip LED of claim 1, wherein the isolated active area is isolated by a silk screen.

4. The multichip LED of claim 1, wherein the isolated active area is isolated by a photo resist.

5. A multichip light emitting diode (LED), comprising:
   a plurality of LED chips in electrical contact with each other, the plurality of LED chips consisting of a blue LED chip, a red LED chip, a green LED chip, and a target LED chip;
   a set of conformal coatings that cover an isolated active area of the plurality of LED chips, wherein each conformal coating of the set of conformal coatings comprises a phosphor and silicon ratio producing colors selected from a group consisting of yellow, green, and red that is based on a measurement of a wavelength of a light output that is particular to an LED chip of the plurality of LED chips that is covered by the each conformal coating;
   wherein a light output of the target LED chip is converted to white light using the set of conformal coatings; and
   wherein the plurality of LED chips are interconnected with a metal line.

6. The multichip LED of claim 5, where colors are produced by a power supply.

7. The multichip LED of claim 5, wherein the isolated active area is isolated by at least one of paraffin wax, silk screen and photo resist.

* * * * *